(12) United States Patent
Nakagawa et al.

(10) Patent No.: US 10,205,433 B2
(45) Date of Patent: Feb. 12, 2019

(54) ELASTIC WAVE DEVICE

(71) Applicant: Murata Manufacturing Co., Ltd., Nagaokakyo-shi, Kyoto-fu (JP)

(72) Inventors: Ryo Nakagawa, Nagaokakyo (JP); Chihiro Konoma, Nagaokakyo (JP); Masashi Tsubokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 3 days.

(21) Appl. No.: 15/465,632

(22) Filed: Mar. 22, 2017

(65) Prior Publication Data

US 2017/0338795 A1    Nov. 23, 2017

(30) Foreign Application Priority Data

May 17, 2016    (JP) .................. 2016-098395

(51) Int. Cl.
| | |
|---|---|
| *B06B 1/06* | (2006.01) |
| *H03H 9/02* | (2006.01) |
| *H03H 9/56* | (2006.01) |
| *H01L 41/047* | (2006.01) |
| *H03H 9/13* | (2006.01) |

(52) U.S. Cl.
CPC ....... *H03H 9/02559* (2013.01); *B06B 1/0644* (2013.01); *B06B 1/0662* (2013.01); *H01L 41/0477* (2013.01); *H03H 9/131* (2013.01); *H03H 9/56* (2013.01)

(58) Field of Classification Search
CPC .............. H03H 9/02559; B06B 1/0644; H01L 41/0477
USPC .......................................... 333/186
See application file for complete search history.

(56) References Cited

U.S. PATENT DOCUMENTS

2003/0006863 A1*    1/2003  Inoue ................. H03H 3/08
333/193

FOREIGN PATENT DOCUMENTS

JP      2012-175315 A      9/2012

OTHER PUBLICATIONS

Mechanical Translation of JP 2012-175315, translated May 17, 2018.*

* cited by examiner

*Primary Examiner* — Stephen E. Jones
*Assistant Examiner* — Samuel S Outten
(74) *Attorney, Agent, or Firm* — Keating & Bennett, LLP

(57) ABSTRACT

An elastic wave device includes a substrate including a piezoelectric material layer and an IDT electrode on the piezoelectric material layer. The IDT electrode includes a Pt film, a Ti film on the Pt film, and an Al-based metal film on the Ti film. The Ti film is quasi-single-crystalline.

11 Claims, 4 Drawing Sheets

ELASTIC WAVE DEVICE

CROSS REFERENCE TO RELATED APPLICATIONS

This application claims the benefit of priority to Japanese Patent Application No. 2016-098395 filed on May 17, 2016. The entire contents of this application are hereby incorporated herein by reference.

BACKGROUND OF THE INVENTION

1. Field of the Invention

The present invention relates to an elastic wave device that includes a piezoelectric material layer and an interdigital transducer (IDT) electrode thereon.

2. Description of the Related Art

Various elastic wave devices are known that have an IDT electrode formed by stacked metal films. For example, the elastic wave device described in Japanese Unexamined Patent Application Publication No. 2012-175315 includes a piezoelectric substrate and an IDT electrode thereon. This IDT electrode has a structure in which NiCr, Pt, Ti, and AlCu films are stacked from the piezoelectric substrate side. The Ti film prevents atomic diffusion between the Pt and AlCu films.

This Ti film is not a sufficiently effective diffusion barrier when polycrystalline.

SUMMARY OF THE INVENTION

Accordingly, preferred embodiments of the present invention provide an elastic wave device in which atomic diffusion is prevented to a sufficient extent.

According to a preferred embodiment of the present invention, an elastic wave device includes a substrate including a piezoelectric material layer and an IDT electrode on the piezoelectric material layer. The IDT electrode includes a Pt film, a Ti film on the Pt film, and an Al-based metal film on the Ti film. The Ti film is quasi-single-crystalline.

In a particular aspect of an elastic wave device according to a preferred embodiment of the present invention, an X-ray diffraction pole figure of a Ti(200) plane of the Ti film exhibits a peak pattern substantially having three- or six-fold symmetry.

In another particular aspect of an elastic wave device according to a preferred embodiment of the present invention, the Al-based metal film is an Al film or Al alloy film.

In yet another particular aspect of an elastic wave device according to a preferred embodiment of the present invention, the Al alloy film is an AlCu alloy film.

In the elastic wave devices according to preferred embodiments of the present invention, atomic diffusion is prevented to a sufficient extent because of the presence of the quasi-single-crystalline Ti film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following makes the present invention more clearly understood by describing some specific preferred embodiments of the present invention with reference to the drawings.

The preferred embodiments set forth herein are illustrative. It is possible to replace or combine elements or features of the structure of a preferred embodiment with that of another preferred embodiment.

Figure 1:
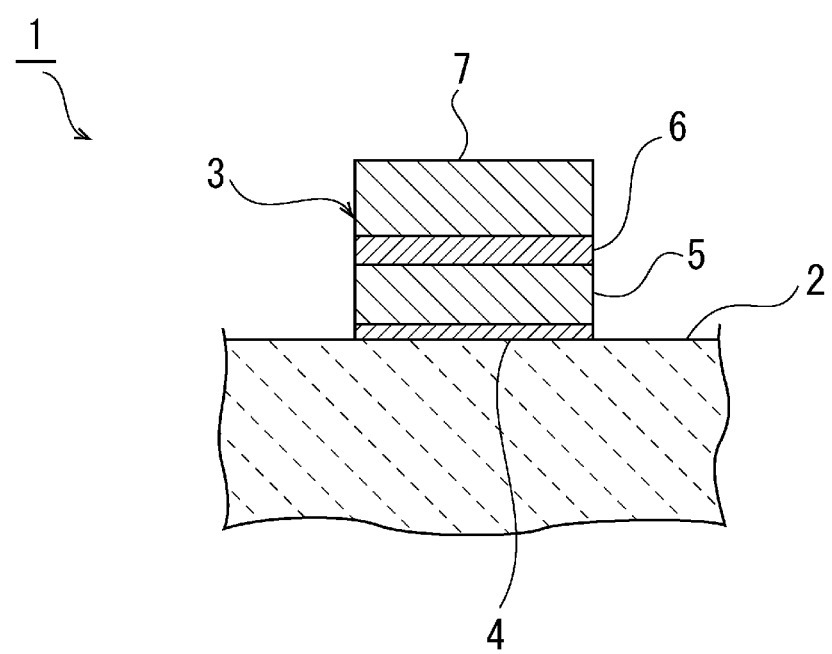
FIG. 1 is a front cross-section for illustrating the electrode structure of an elastic wave device according to a preferred embodiment of the present invention.

FIG. 1 is a front cross-section for illustrating the electrode structure of an elastic wave device according to a preferred embodiment of the present invention.

The elastic wave device 1 includes a piezoelectric substrate 2. The piezoelectric substrate 2 is a $LiTaO_3$ substrate, but the piezoelectric substrate 2 may alternatively be made from any other piezoelectric single crystal such as $LiNbO_3$. In this preferred embodiment of the present invention, the substrate does not need to be a layer of a piezoelectric material as a whole, i.e., a piezoelectric substrate, as long as it has a piezoelectric material layer. The substrate may have a structure in which there is a piezoelectric material layer on a supporting substrate.

There is an IDT electrode 3 on the piezoelectric substrate 2. The IDT electrode 3 includes a Ti film 4, a Pt film 5, a Ti film 6, and an AlCu alloy film 7. The Ti film 4 more firmly adheres to the piezoelectric substrate 2 than the Pt film 5 does. The Ti film 4 is therefore an adhesion layer.

The Ti film 6 prevents atomic diffusion between the Pt film 5 and the AlCu alloy film 7. The Ti film 6 is therefore a diffusion barrier layer.

The AlCu alloy layer 7 reduces the insertion loss due to its electric resistance lower than that of the Pt film 5. The AlCu alloy film 7 is an AlCu alloy film in which Al is the base metal. In this preferred embodiment of the present invention, it is possible to use another kind of Al-based alloy film instead of the AlCu alloy film 7. The AlCu alloy film 7 can also be replaced with an Al film.

Figure 2:
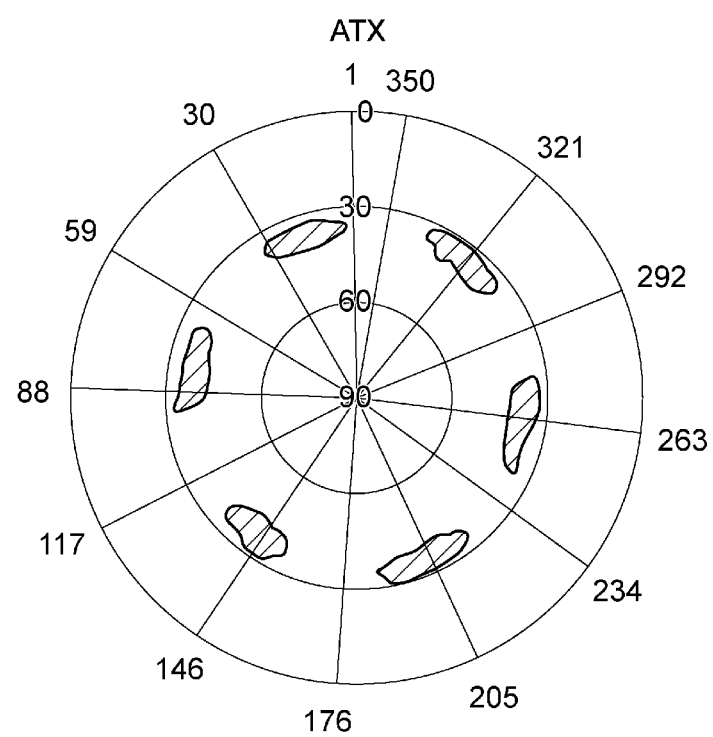
FIG. 2 is an X-ray diffraction (XRD) pole figure of a quasi-single-crystalline Ti film of an elastic wave device according to a preferred embodiment of the present invention.

One of the unique features of the elastic wave device 1 is that the Ti film 6 is quasi-single-crystalline. Being quasi-single-crystalline means that the film is not polycrystalline but an X-ray diffraction (XRD) pole figure of its Ti(200) plane exhibits a peak pattern substantially having three- or six-fold symmetry. FIG. 2 is an XRD pole figure of a Ti film. In this figure, the peak pattern from the Ti(200) plane substantially has six-fold symmetry.

Figure 3:
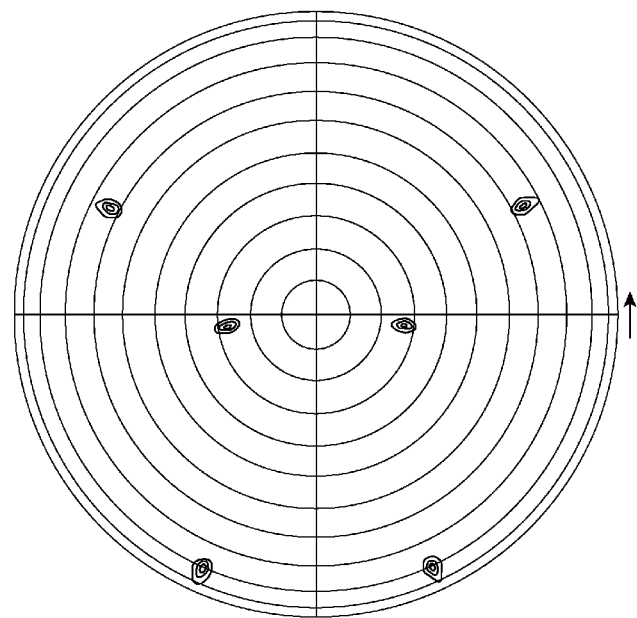
FIG. 3 is an X-ray diffraction (XRD) pole figure of a Ti film located above a Pt film on a piezoelectric substrate in an elastic wave device according to a preferred embodiment of the present invention.

In practice, since the IDT electrode 3 is provided on the piezoelectric substrate 2, the symmetry of the Ti film 6 is influenced by the crystal orientation of the piezoelectric substrate 2. FIG. 3 is an XRD pole figure of a Ti film 6 in an IDT electrode 3 actually provided on a piezoelectric substrate 2. The peaks in a substantially six-fold symmetric pattern in this drawing are not in the positions illustrated in FIG. 2.

Figure 4:
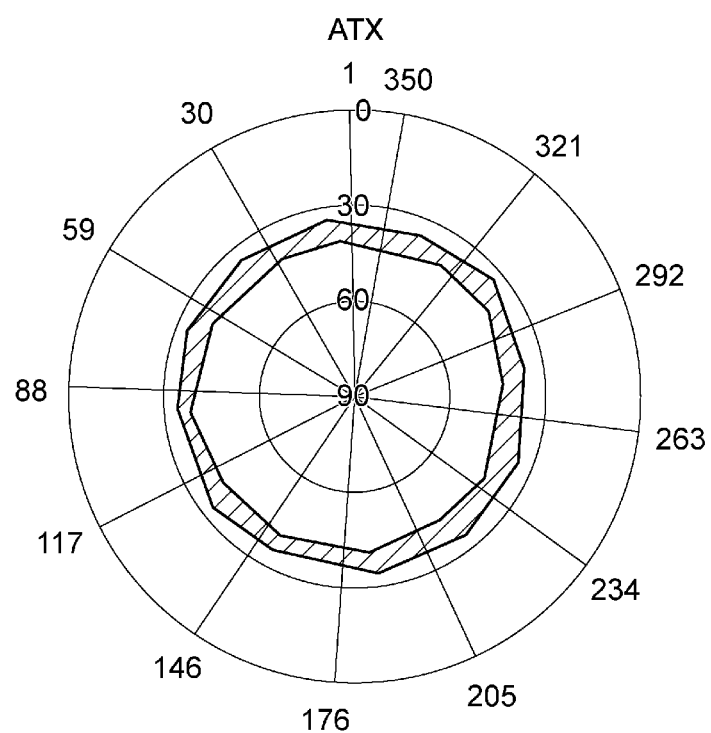
FIG. 4 is an X-ray diffraction (XRD) pole figure of a polycrystalline Ti film.

FIG. 4 is an XRD pole figure of a polycrystalline Ti film. As can be seen from FIG. 4, there is no peak pattern substantially having six-fold symmetry. The pole figure does not contain a peak pattern having three-fold symmetry either.

A Ti film is generally accepted as being quasi-single-crystalline, not polycrystalline, when an X-ray diffraction pole figure of its Ti(200) plane exhibits a peak pattern substantially having three- or six-fold symmetry as in the foregoing. Such a Ti film contains much fewer grain boundaries than a polycrystalline Ti film. This makes the Ti film 6 an extremely effective diffusion barrier. The Ti film 6 is thus sufficiently effective in preventing atomic diffusion even when thin. This allows the manufacturer to provide an elastic wave device 1 in which the Ti film 6 is thin.

Since even a thin Ti film 6 is sufficiently effective in preventing atomic diffusion, the manufacturer is able to reduce the electric resistance of the electrode fingers, and therefore reduce the transmission loss through the device, by thickening the AlCu alloy film 7.

While FIG. 2 illustrates a peak pattern substantially having six-fold symmetry, peak patterns substantially having three-fold symmetry are also acceptable.

While in the above preferred embodiment, a Ti film 4, a Pt film 5, a Ti film 6, and an AlCu alloy film 7 are preferably stacked in this order from the piezoelectric substrate 2 side, the IDT electrode according to a preferred embodiment of the present invention only needs to have a multilayer structure in which there is a Ti film on a Pt film and there is an Al or AlCu alloy film on the Ti film. The rest of the multilayer portion of the IDT electrode is not critical. The Ti adhesion layer 4 may therefore be replaced with a NiCr film and can even be omitted.

Elastic wave devices according to this preferred embodiment of the present invention preferably include the above-described multilayer structure of an IDT electrode. The rest of their structure is therefore not critical. Preferred embodiments of the present invention are therefore able to be applied to various elastic wave devices including longitudinally coupled resonator-type elastic wave filters besides elastic wave resonators.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a substrate including a piezoelectric material layer; and
    an IDT electrode on the piezoelectric material layer; wherein
    the IDT electrode includes a first Ti film, a Pt film, a second Ti film, and an Al-based metal film that are stacked in this order on the piezoelectric material layer; and
    the second Ti film that is between the Pt film and the Al-based metal film is quasi-single-crystalline.

2. The elastic wave device according to claim 1, wherein the Al-based metal film is an Al film or Al alloy film.

3. The elastic wave device according to claim 2, wherein the Al alloy film is an AlCu alloy film.

4. The elastic wave device according to claim 1, wherein the substrate is a piezoelectric substrate.

5. The elastic wave device according to claim 4, wherein the piezoelectric substrate is one of a $LiTaO_3$ substrate and a $LiNbO_3$ substrate.

6. The elastic wave device according to claim 1, wherein an X-ray diffraction pole figure of a Ti(200) plane of the Ti film exhibits a peak pattern substantially having three- or six-fold symmetry.

7. The elastic wave device according to claim 1, wherein the substrate is one of a $LiTaO_3$ substrate and a $LiNbO_3$ substrate.

8. The elastic wave device according to claim 1, wherein the first Ti film is an adhesion layer.

9. The elastic wave device according to claim 1, wherein
    the Al-based metal film is an AlCu alloy film; and
    the second Ti film is a diffusion barrier layer that prevents atomic diffusion between the Pt film and the AlCu alloy film.

10. The elastic wave device according to claim 1, wherein
    the Al-based metal film is an AlCu alloy layer; and
    the AlCu alloy layer reduces insertion loss due to its electric resistance lower than that of the Pt film.

11. The elastic wave device according to claim 1, wherein the elastic wave device is one of a longitudinally coupled resonator-type elastic wave filter and an elastic wave resonator.

* * * * *